(12) United States Patent
Mochizuki

(10) Patent No.: US 7,233,029 B2
(45) Date of Patent: Jun. 19, 2007

(54) OPTICAL FUNCTIONAL FILM, METHOD OF FORMING THE SAME, AND SPATIAL LIGHT MODULATOR, SPATIAL LIGHT MODULATOR ARRAY, IMAGE FORMING DEVICE AND FLAT PANEL DISPLAY USING THE SAME

(75) Inventor: Fumihiko Mochizuki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 101 days.

(21) Appl. No.: 10/758,286

(22) Filed: Jan. 16, 2004

(65) Prior Publication Data

US 2004/0219698 A1 Nov. 4, 2004

(30) Foreign Application Priority Data

Jan. 17, 2003 (JP) .................. P.2003-009658

(51) Int. Cl.
*H01L 33/00* (2006.01)
*G02F 1/33* (2006.01)

(52) U.S. Cl. .................. 257/98; 257/E33.069; 359/308

(58) Field of Classification Search .................. 257/89, 257/E33.069, E31.123; 359/214, 308
See application file for complete search history.

(56) References Cited

U.S. PATENT DOCUMENTS

| | | | | |
|---|---|---|---|---|
| 5,291,502 A | * | 3/1994 | Pezeshki et al. ............... | 372/20 |
| 5,978,408 A | * | 11/1999 | Thornton ...................... | 372/96 |
| 6,324,192 B1 | * | 11/2001 | Tayebati ........................ | 372/20 |
| 6,327,071 B1 | * | 12/2001 | Kimura ........................ | 359/291 |
| 6,429,151 B1 | * | 8/2002 | Moore et al. ................ | 438/791 |
| 2001/0048118 A1 | * | 12/2001 | Uchida et al. ............... | 257/190 |
| 2002/0053720 A1 | * | 5/2002 | Boursat et al. .............. | 257/640 |
| 2002/0154675 A1 | * | 10/2002 | Deng et al. .................... | 372/96 |
| 2003/0116711 A1 | * | 6/2003 | Hara et al. ................. | 250/338.1 |
| 2004/0012835 A1 | * | 1/2004 | Ohbayashi et al. .......... | 359/237 |

FOREIGN PATENT DOCUMENTS

| JP | 6-186418 A | 7/1994 |
|---|---|---|
| JP | 8-307008 A | 11/1996 |
| JP | 2000-028931 A | 1/2000 |
| JP | 2002-174721 A | 6/2002 |

OTHER PUBLICATIONS

M. C. Larson et al., "Vertical Coupled-Cavity Microinterferometer on GaAs with Deformable-Membrane Top Mirror," IEEE Photonics Technology Letters, vol. 7, No. 4, Apr. 1995.*

* cited by examiner

*Primary Examiner*—Carl Whitehead, Jr.
*Assistant Examiner*—Jennifer M. Dolan
(74) *Attorney, Agent, or Firm*—Sughrue Mion, PLLC

(57) ABSTRACT

An optical functional film comprises a multilayer film formed by stacking a plurality of films. The plurality of films are formed by a same material and refractive indices of adjacent films are different.

5 Claims, 9 Drawing Sheets n4 = L
n3 = H
n2 = L
n1 = H

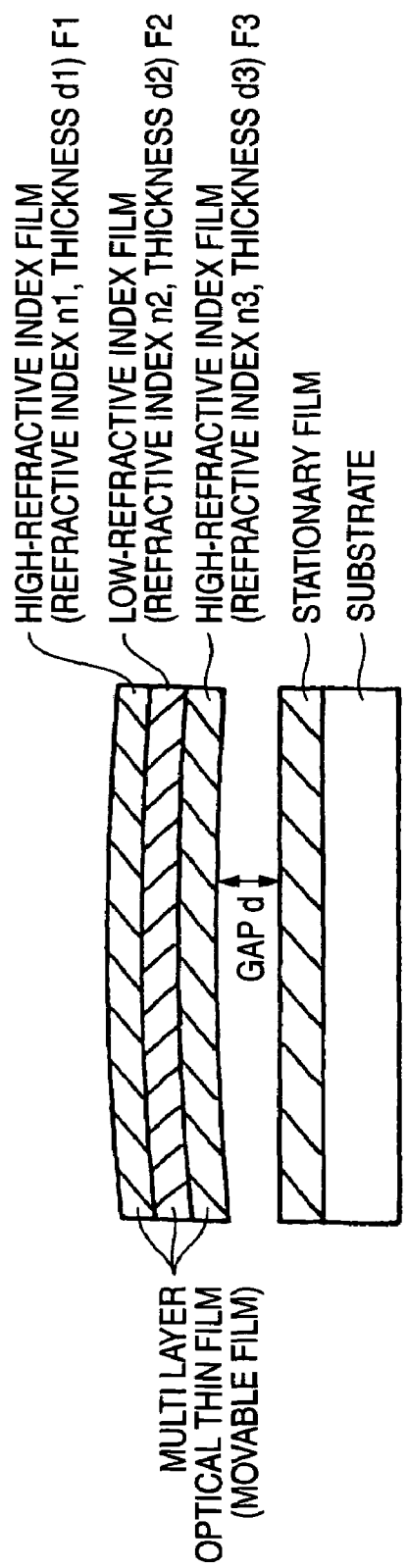

OPTICAL FUNCTIONAL FILM, METHOD OF FORMING THE SAME, AND SPATIAL LIGHT MODULATOR, SPATIAL LIGHT MODULATOR ARRAY, IMAGE FORMING DEVICE AND FLAT PANEL DISPLAY USING THE SAME

BACKGROUND OF THE INVENTION

1. Field of the Invention

The present invention relates to an optical functional film in which stacked films are made of the same material and have an optical function, and a stress control has been applied to each film, and a method of forming the optical functional film. The present invention also relates to a spatial light modulator, a spatial light modulator array, an image forming device, and a flat panel display which use the optical functional film.

2. Description of the Art

A dielectric multilayer film in the related art is produced by alternately stacking high-refractive index films and low-refractive index films. As useful materials, for example, $TiO_2$ is usually used in a high-refractive index film, and $SiO_2$ is usually used in a low-refractive index film. In the case where such a dielectric multilayer film is to be produced as an optically reflective film, the materials are stacked in the sequence of high and low refractive indices so as to attain an optical length of $\lambda/4$ with respect to the wavelength of light. This production process has problems of curvature of a support member, a crack, and a film flake which are caused by an internal stress of the dielectric multilayer film.

In "Method of producing a dichroic mirror" of JP-A-6-186418 (paragraph Nos. [00009] to [0011]), a method of correcting curvature is disclosed. In a dichroic mirror, dielectric thin films for varying the light transmittance depending on the wavelength are stacked on a substrate. The dielectric thin films include low-refractive index films made of $SiO_2$, and high-refractive index films made of $TiO_2$, and are grown in a vacuum or an atmosphere of a specific gas by vacuum deposition. In the disclosed method, curvature which may be caused in the film growing process is compensated by performing the film growing process on a substrate having a shape that is opposite to the shape of the curvature.

In "Multilayer film structure and surface-emitting laser" of JP-A-8-307008 (paragraph Nos. [0022] to [0029], FIG. 2), a method of preventing distortion from occurring is disclosed. When a multilayer film 4 which is to be applied to a reflecting mirror of a surface-emitting laser is formed by a dielectric multilayer film of $SiO_2$ films 2 and $TiO_2$ films 3, a contraction stress which is produced in the $SiO_2$ films and is indicated by the arrows is different in magnitude from an expansion stress which is produced in the $TiO_2$ films as shown in FIG. 16B, so that contraction and expansion occur in the stacked planes, thereby causing distortion in a substrate. By contrast, in the disclosed method, as shown in FIG. 16A, a control is conducted while conditions such as the deposition rate and the deposition atmosphere are selected so that an expansion stress and a contraction stress have an equal magnitude. Namely, a contraction stress/tensile stress control is conducted so that an expansion stress and a contraction stress which are produced in respective alternately stacked films are made equal to each other to balance and cancel out. Therefore, the structure is improved so that distortion is not produced.

FIG. 17 shows an example of a Fabry-Perot filter which is disclosed in JP-A-2002-174721 (paragraph Nos. [0025] to [0035], FIG. 5), and in which a dielectric multilayer film is used. In the figure, shown is a three-layer structure consisting of a high-refractive index film F1 which serves as a movable mirror, and which exhibits a compression stress, a low-refractive index film F2 which exhibits a tensile stress, and a high-refractive index film F3 which exhibits a compression stress. The multilayer optical thin film has an optical film thickness of $\lambda/4$, or is a multilayer film corresponding to a single-layer film having an optical film thickness of $\lambda/4$.

When a movable mirror is formed by a multilayer optical thin film in which films (tensile stress films) exhibiting a tensile-stress and films (compression stress films) exhibiting a compression stress are stacked, or by that in which tensile stress films exhibiting different tensile stresses are stacked, a self-standing movable mirror can be formed so as to be upward convex and downward convex. The tensile stress films and the compression stress films can be formed respectively by, for example, polysilicon (single crystal silicon), silicon oxide, silicon nitride. Combinations of a tensile stress film and a compression stress film, and those of tensile stress films include combinations of: a compression stress film (polysilicon) and a tensile stress film (silicon nitride); a compression stress film (polysilicon) and a tensile stress film (silicon oxide); a compression stress film (silicon oxide) and a tensile stress film (polysilicon); a compression stress film (silicon nitride) and a tensile stress film (polysilicon); a tensile stress film (polysilicon) and a tensile stress film (silicon nitride); and a tensile stress film (polysilicon) and a tensile stress film (silicon oxide).

When the multilayer optical thin film (movable mirror) is configured as an optical thin film of a multilayer structure in which the high-refractive index film F1, the low-refractive index film F2, and the high-refractive index film F3 are stacked in this sequence, it is possible to enhance the degree of freedom in design of the film stress.

However, all the above-described techniques in the related art have a serious problem in that the adhesiveness between films remains to be inferior.

SUMMARY OF THE INVENTION

Therefore, the inventor of the present invention has studied the cause of the inferior adhesiveness between films, and found that the formation with using two or more kinds of materials or a high-refractive index material and a low-refractive index material causes the problem.

Furthermore, also the following problem in that the formation requires a prolonged time period for the supply of the materials, degassing, and cleaning of an apparatus in the film growing process due to vapor deposition in an atmosphere of a specific gas has been found.

It is an object of the invention to provide an optical functional film having an excellent film adhesiveness of a multilayer film, and also to provide a dielectric multilayer film which can be provided with an optical function, and in which a stress control is easily conducted, also a refractive index control is enabled, a stress of the whole multilayer film can be controlled, and the film grown is performed at a higher rate.

It is another object of the invention to provide a spatial light modulator, a spatial light modulator array, an image forming device, and a flat panel display which use such an optical functional film.

In order to attain the object, according to a first aspect of the invention, there is provided an optical functional film comprising a multilayer film having a plurality of stacked films, wherein the plurality of films are formed of a same material, and refractive indices of adjacent ones of the plurality of films are different from each other.

In the optical functional film, the same material is used in all the films of the multilayer film. Therefore, the optical functional film can be produced in the same production apparatus, in the same process, and under the same conditions. As a result, the kinds of gasses to be used can be reduced, it is not required to clean the production apparatus, a prolonged time period is not required for the supply of the materials and degassing in the film growing process, the durability is excellent, the yield is high, and the film adhesiveness is excellent because of the same material.

According to a second aspect of the invention, there is provided an optical functional film as set forth in the first aspect of the invention, wherein stresses of prescribed ones of the plurality of films of the multilayer film have opposite signs with respect to adjacent ones of the plurality of films.

In the optical functional film, the films are alternately stacked while setting a first layer to a contraction (compression) stress state, and a second layer to an expansion (tensile) stress state, thereby enabling a multilayer film having a high flatness to be grown.

According to a third aspect of the invention, there is provided an optical functional film as set forth in the first aspect of the invention, wherein stresses of prescribed ones of the plurality of films of the multilayer film have opposite signs and an equal magnitude with respect to adjacent ones of the plurality of films.

In the optical functional film, the films are alternately stacked while setting a first layer to a contraction (compression) stress state, a second layer to an expansion (tensile) stress state, and the stresses to have an equal magnitude, thereby enabling a multilayer film having a high flatness to be grown.

According to a forth aspect of the invention, there is provided an optical functional film as set forth in the first aspect of the invention, wherein the multilayer film is grown by chemical vapor deposition (CVD).

In the optical functional film, the kinds of material gasses can be reduced, the film growth can be satisfactorily performed, the film growth rate is high, and the degassing process does not require a prolonged time period.

According to a fifth aspect of the invention, there is provided a method of forming an optical functional film comprising a multilayer film formed by stacking a plurality of films in CVD, the method including: forming the plurality of films with a same material; and adjusting at least one of a frequency of a radio-frequency voltage to be applied, an RF power, and a gas flow rate ratio, on forming each of the films, to control a stress and a refractive index of each of the films so that refractive indices of adjacent films are different from each other.

According to the method, it is possible to attain the effect that the stress and refractive index controls can be conducted more easily.

According to a sixth aspect of the invention, there is provided a spatial light modulator comprising: a support substrate that has an electrode layer; and a movable thin film that has at least an electrode layer, the movable thin film being opposingly placed above the support substrate with being separated by a predetermined gap distance in a manner that the movable thin film is flexurally deformable toward the support substrate, wherein a predetermined driving voltage is applied between the electrode layer of the support substrate and the electrode layer of the movable thin film to cause the movable thin film to be deflected toward the support substrate by an electrostatic force acting between the electrode layers, whereby optical characteristics of the device with respect to incident light are changed to perform light modulation on the incident light, and wherein an optical functional film as set forth in any one of the first to fourth aspects of the invention is disposed on each of sides of the movable thin film and the support substrate, the sides being opposed to each other, and the optical characteristics are optical interference characteristics corresponding to the gap distance between the movable thin film and the support substrate, and a wavelength of the incident light.

In the spatial light modulator, multilayer reflective films are on the support substrate and the movable thin film, respectively so as to be opposed to each other, and the gap distance between the multilayer reflective films is changed to allow optical interference to be performed by the Fabry-Perot interference effect or the like in accordance with the wavelength of the incident light.

According to a seventh aspect of the invention, there is provided a spatial light modulator array wherein plural spatial light modulators as set forth in the sixth aspect of the invention are arranged one- or two-dimensionally.

In the thus configured spatial light modulator array, since the plural spatial light modulators are arranged one- or two-dimensionally, one- or two-dimensional light modulation can be performed.

According to an eighth aspect of the invention, there is provided an image forming device comprising: a light source; a spatial light modulator array as set forth in the seventh aspect of the invention; an illumination optical system which illuminates the spatial light modulator array with light from the light source; and a projection optical system which projects light emitted from the spatial light modulator array onto an image forming face.

In the thus configured image forming device, the spatial light modulator is illuminated with the light from the light source, and light which is modulated by the spatial light modulator array is projected by the projection optical system onto the image forming face.

According to a ninth aspect of the invention, there is provided a flat panel display comprising: a light source which emits ultraviolet rays; a spatial light modulator array as set forth in the seventh aspect of the invention; an illumination optical system which illuminates the spatial light modulator array with light from the light source; and a fluorescent member which is excited by light emitted from the spatial light modulator array to emit light.

In the thus configured flat panel display, the spatial light modulator array is illuminated with the ultraviolet rays from the light source, the fluorescent member is illuminated with ultraviolet rays which are emitted by a modulating operation from the spatial light modulator array, and the fluorescent member is excited to emit display light.

BRIEF DESCRIPTION OF THE DRAWINGS

FIG. 17 is a section view of a Fabry-Perot filter in which a dielectric multilayer film disclosed in JP-A-2002-174721 is used.

DETAILED DESCRIPTION OF THE INVENTION

Hereinafter, an embodiment of the invention will be described with reference to the figures.

Figure 1:
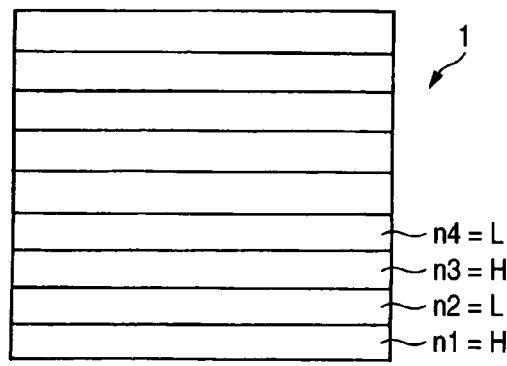
FIG. 1 is a section view of an optical functional film of an embodiment of the invention which is made of the same material.

FIG. 1 is a section view of an optical functional film of the embodiment of the invention.

Referring to FIG. 1, 1 denotes a dielectric multilayer film mirror configuration which is stackingly formed with using a same material such as SiNx as a film material. In the specification, the term "same material" means that the same principal material is used in film growing processes, and "films made of a same material" means films made of same kinds of elements. In the case where dielectric films are to be formed by the plasma CVD method with using SiNx as a dielectric material, a silane gas and an ammonia gas are used as source gases, hydrogen and nitrogen are used as additive gases, and the gases are decomposed by an RF (radio-frequency) power to form thin films. In this case, the principal material means the silane gas and the ammonia gas serving as the source gases. In place of SiNx, another film material such as SiONx or SiOx may be used. Alternatively, tetraethylorthosilicate (TEOS):$Si(OC_2H_5)_4$ may be used. In the alternative, thin films are formed by the liquid source CVD method. The formed thin films are made of same kinds of elements. However, films having different refractive indices, degrees of densification, and stresses in the films can be formed because films of different composition ratios can be formed by controlling the film forming process. In the figure, n1, n2, n3, . . . indicate the indices of the films, respectively. The embodiment is characterized in that high- and low-refractive index films of the same material are alternately stacked so that n1=H, n2=L, . . . (where H: high refractive index, L: low refractive index). Namely, plural films are formed by the same material, and adjacent ones of the films have different refractive indices.

The difference between the high and low refractive indices is set to about 1.7 to 2.3.

Each of the films has a thickness which is equal to an optical length of λ/4n.

As the number of films is larger, the reflectivity is higher, and, as the difference between H and L is larger, the reflectivity is higher.

Next, a method of growing the films will be described.

An example in which the dielectric multilayer film is produced in the form of SiNx films by the plasma CVD (Chemical Vapor Deposition) method.

In plasma CVD, a radio-frequency power of, for example, 13.56 MHz from a radio-frequency power supply is applied to a radio-frequency electrode and a substrate heater which are opposed to each other in a reaction vessel, material gasses such as silane gas and ammonia gas introduced through gas inlet pipes are decomposed by glow discharge plasma due to the radio-frequency power to form a thin film on a substrate, and the residual gas is discharged to the outside of the vessel by a pump. In the embodiment, since plural thin films are formed by the same material to be stacked, the kinds of materials can be reduced, and the time period for evacuating the residual gas is short.

Figure 2:
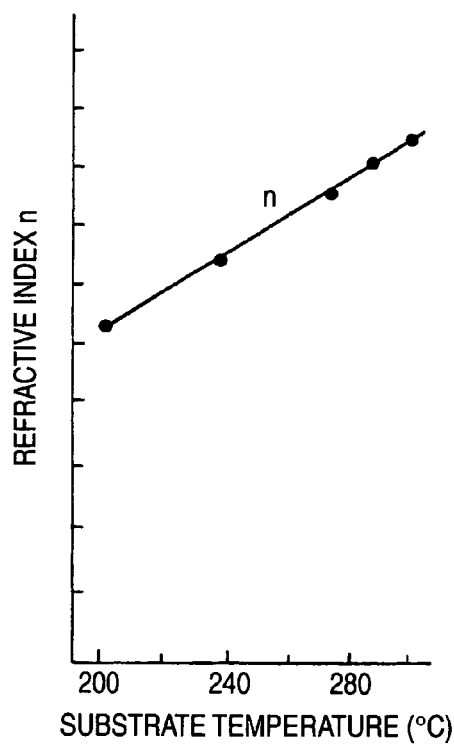
FIGS. 2A and 2B are views showing the characteristic of film growth by plasma CVD according to the invention.
Figure 2:
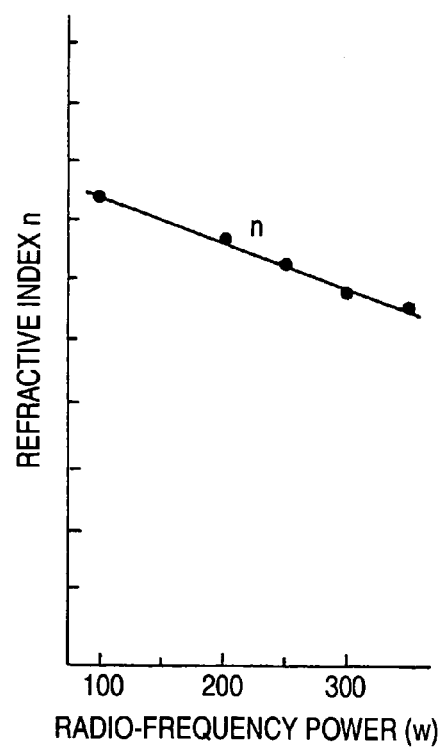

First, the control of the refractive indices will be described. The characteristic of a thin film of SiNx to be grown is shown in FIG. 2. FIG. 2A shows the relationship between the substrate temperature and the refractive index, and FIG. 2B shows the relationship between the radio-frequency power and the refractive index.

In FIG. 2A, the refractive index n is substantially linearly increased when the temperature is raised, and, in FIG. 2B, the refractive index n moves along a curve which decreases in accordance with the increase of the radio-frequency power. The refractive indices can be controlled by using these phenomena.

In plasma CVD, the relationship between a stress and a refractive index is in one of the following cases depending on the film growth conditions;

"when a compression stress is applied, the refractive index is high, and, when a tensile stress is applied, the refractive index is low"; and "when a compression stress is applied, the refractive index is low, and, when a tensile stress is applied, the refractive index is high".

When the tensile stress or the compression stress is increased, the high refractive index is shifted in the increasing direction, and the low refractive index is shifted in the decreasing direction. The correction control can be conducted in further consideration of these conditions.

Figure 3:
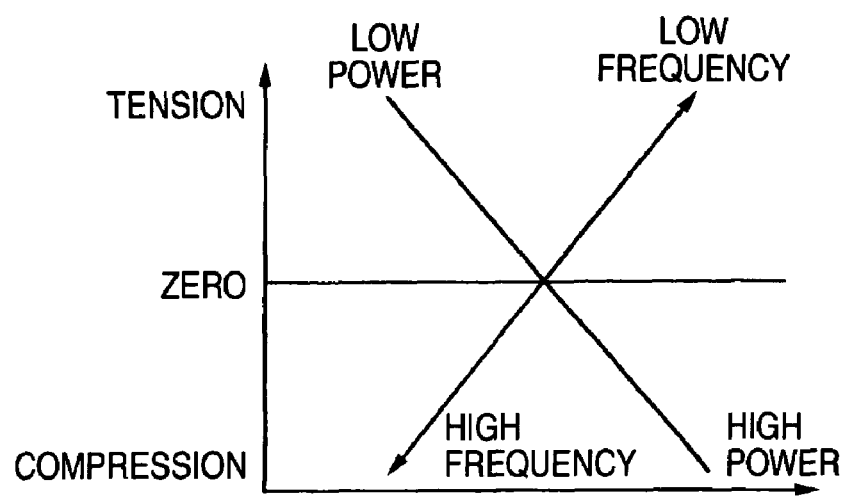
FIG. 3 is a view showing a method of controlling a stress by plasma CVD shown in FIG. 2.

As shown in the diagram of FIG. 3, the method of controlling a stress is performed by one of the followings:

(A) the frequency of the radio-frequency power for generating a plasma is changed;

(B) the radio-frequency power is changed; and (C) the flow rate ratio of the gasses to be used is changed.

In the frequency change of (A), the stress relationship can be controlled so that a tensile stress is higher in a lower frequency side, and the compression stress is higher in a higher frequency side.

In the RF power change of (B), the stress relationship can be controlled so that a tensile stress is higher in a lower power side, and the compression stress is higher in a higher power side.

In the gas flow rate ratio change of (C), the gas concentrations of, for example, $(SiH_4/NH_3/N_2/H_2)$ are changed, and the gas pressures are changed, whereby stresses can be controlled.

In (D), a control in which two or more of (A), (B), and (C) above are combined with each other is performed so as to enable a further fine control. Namely, in the formation of each of the films, the stress and the refractive index of the film are controlled by adjusting at least one of the frequency of the radio-frequency voltage to be applied, the RF power, and the gas flow rate ratio, whereby adjacent films are formed so as to have different refractive indices.

As a result, the stress control (compression or tensile) is facilitated, and, when stresses are changed, also the refractive indices are changed. Therefore, the refractive index control (higher or lower) can be simultaneously conducted, and the stress control to be conducted on stresses including stresses of the films and a stress of the whole multilayer film is enabled on the basis of relationships among the thicknesses of the films.

Under the film growth control, the dielectric multilayer film 1 is grown in the following manner. First, the first film is grown while being controlled so as to attain a high refractive index. Then, the second film is grown while being controlled so as to attain a low refractive index and a stress which is equal in magnitude to the stress of the first film. Namely, a predetermined one of the films in the multilayer film is caused to have a stress the sign of which is opposite to the signs of the stresses of the adjacent films. In addition, the stress of the predetermined film is equal in magnitude to the stresses of the adjacent films.

Then, the third and fourth films are similarly grown, with the result that a satisfactory flatness is obtained.

In order to obtain a certain reflectivity, the number of required films is larger as the difference between the refractive indices H (high) and L (low) is smaller. In other words, the number of films is smaller as stresses of the films are larger.

The thus obtained dielectric multilayer film may be applied to a flat panel display using Fabry-Perot interference which has been disclosed in JP-A-11-258558.

Figure 4:
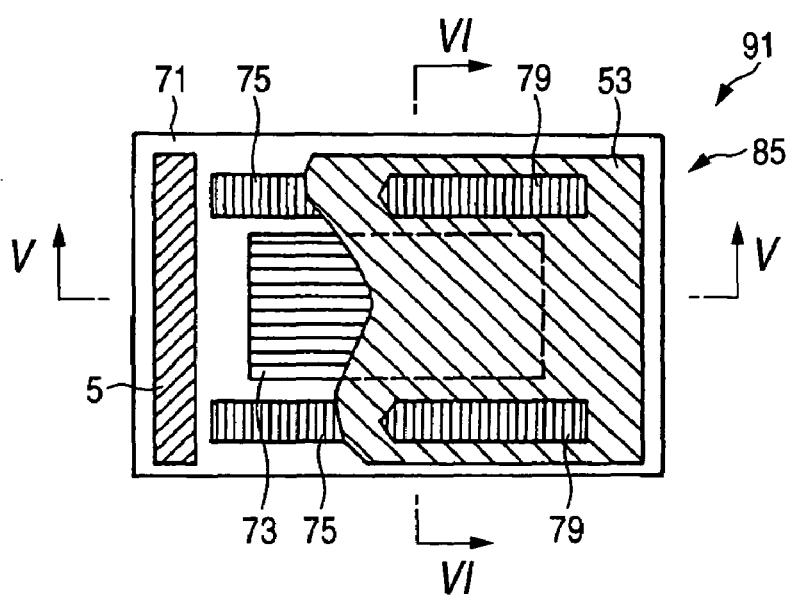
FIG. 4 is a plan view showing a light modulator unit of a flat panel display using Fabry-Perot interference.
Figure 5:
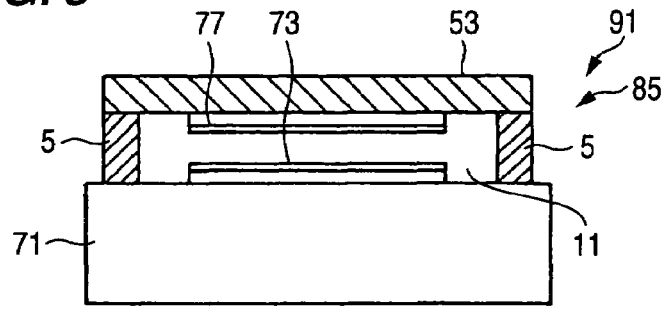
FIG. 5 is a section view taken along line V—V of FIG. 4.
Figure 6:
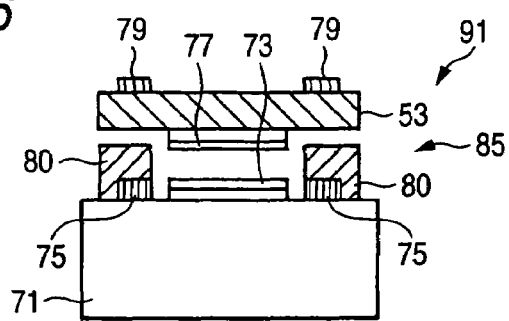
FIG. 6 is a section view taken along line VI—VI of FIG. 4.
Figure 7:
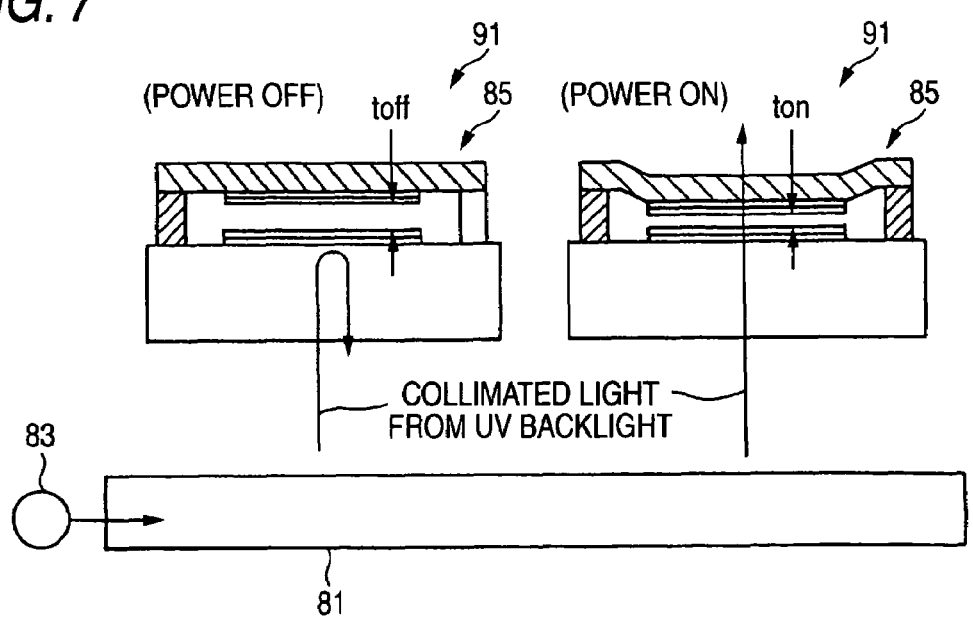
FIG. 7 is a section view illustrating the operation state of the flat panel display shown in FIG. 4.
Figure 8:
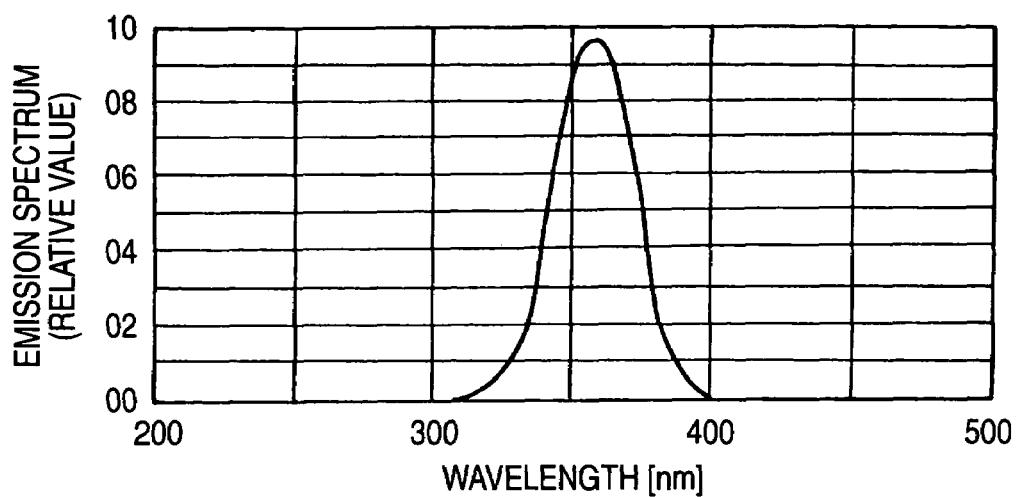
FIG. 8 is a view showing the spectral characteristic of a low-pressure mercury lamp for black light.
Figure 9:
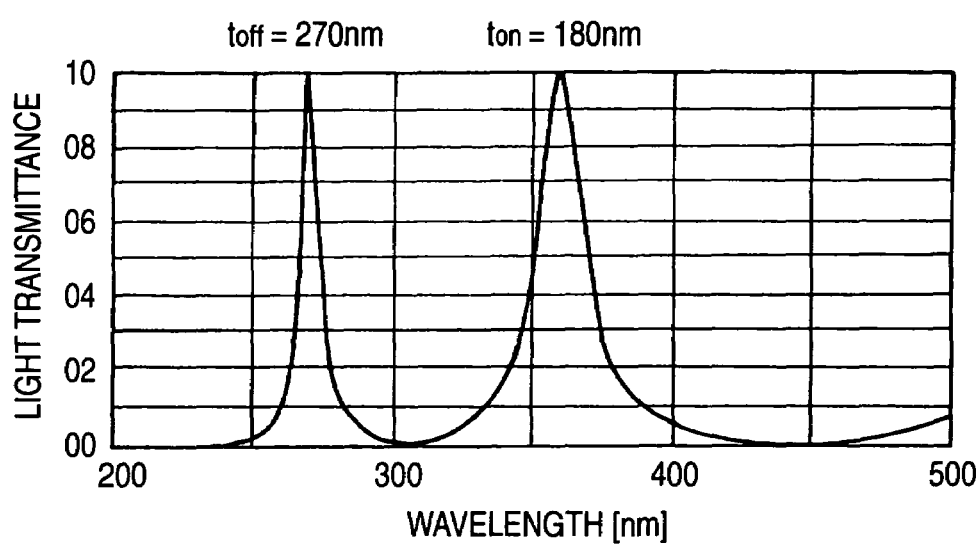
FIG. 9 is a view showing the light transmittance of a spatial light modulator.

FIGS. 4 to 9 illustrate a specific example of the flat panel display using Fabry-Perot interference. FIG. 4 is a plan view showing a light modulator unit of the flat panel display, FIG. 5 is a section view taken along line V—V of FIG. 4, FIG. 6 is a section view taken along line VI—VI of FIG. 4, FIG. 7 is a section view illustrating the operation state of the flat panel display shown in FIG. 4, FIG. 8 is a view showing the spectral characteristic of a low-pressure mercury lamp for black light, and FIG. 9 is a view showing the light transmittance of a spatial light modulator.

A dielectric multilayer film mirror 73 is disposed on a substrate 71 which is transparent to a UV ray. A pair of electrodes 75 are formed respectively on the two sides of the substrate 71 so that the dielectric multilayer film mirror 73 is interposed therebetween. Columns 5 are disposed on the right and left sides (the right and left sides in FIG. 4) of the electrodes 75, respectively. A diaphragm 53 is disposed on the upper end faces of the columns 5. A dielectric multilayer film mirror 77 is formed on the lower face of the diaphragm 53 opposed to the dielectric multilayer film mirror 73. A gap 11 is formed between the dielectric multilayer film mirrors 73 and 77. A pair of other electrodes 79 are formed on the surface of the diaphragm 53 so as to be opposed to the electrodes 75, respectively. In FIG. 6, 80 denotes a spacer.

In other words, the spatial light modulator comprises: the support substrate (the substrate 71) that has an electrode layer; and a movable thin film (the diaphragm 53) that has at least an electrode layer (the electrode 75), and that is opposingly placed above the support substrate 71 with being separated by a predetermined gap distance in a manner that the movable thin film is flexurally deformable toward the support substrate 71. A predetermined driving voltage is applied between the electrode layer 75 of the support substrate 71 and the electrode layer (the electrode 79) of the movable thin film 53 to cause the movable thin film 53 to be deflected toward the support substrate 71 by an electrostatic force acting between the electrode layers 75 and 79, whereby optical characteristics of the device with respect to incident light are changed to perform light modulation on the incident light. The above-described optical functional film (the dielectric multilayer film 1) is disposed on each of sides of the movable thin film 53 and the support substrate 71, the sides being opposed to each other. The optical characteristics are optical interference characteristics corresponding to the gap distance between the movable thin film 53 and the support substrate 71, and the wavelength of the incident light. The details of the optical characteristics will be described later.

As shown in FIG. 7, a UV ray lamp (low-pressure mercury lamp) 83 for black light is disposed on the side face of a plate-like flat light source unit 81. The flat light source unit 81 receives the UV ray emitted from the low-pressure mercury lamp 83 for black light through the side face, and emits it from the surface.

When a fluorescent material (for example, $BaSi_2O_5:Pb^{2+}$) for black light is applied to the inner wall of the low-pressure mercury lamp 83, the emitted UV ray has the spectral characteristic shown in FIG. 8. That is, the center wavelength $\lambda 0$ exists in the vicinity of 360 nm. The UV ray is used as a backlight beam.

In a light modulator unit 85 which is structured as described above, the distance of the gap 11 when no voltage is applied (the state of the left side of FIG. 7) is indicated by $t_{off}$. This distance can be adjusted during a process of producing the device. When a voltage is applied, the distance of the gap 11 is reduced shortened by an electrostatic force (the state of the right side of FIG. 7). The reduced distance is indicated by $t_{on}$. The distance $t_{on}$ can be controlled in accordance with a balance between the applied electrostatic stress and the restoring force which is generated when the diaphragm 53 is deformed. In order to attain a further stable control, as shown in this example, the spacer 80 may be formed on the electrode so as to uniformalize the displacement. When the spacer is made of an insulating material, the specific dielectric constant (1 or greater) of the insulating material attains an effect of lowering the applied voltage. When the spacer is made of a conductive material, this effect is furthermore enhanced. The electrodes and the spacer may be made of the same material. Plural light modulator units 85 are arranged one- or two-dimensionally to constitute a spatial light modulator array.

In this example, the distances $t_{on}$ and $t_{off}$ are set as follows:

$$t_{on} = \tfrac{1}{2} \times \lambda 0 = 180 \text{ nm } (\lambda 0: \text{ the center wavelength of UV ray); and}$$

$$t_{off} = \tfrac{3}{4} \times \lambda 0 = 270 \text{ nm}.$$

The dielectric multilayer film mirrors 73 and 77 are set to have a light reflectivity of R=0.85. The gap 11 is filled with air or rare gas so as to have a refractive index of n=1. The UV ray is collimated, and hence the incident angle i on the light modulator unit 85 is substantially zero. FIG. 9 shows the light transmittance of the light modulator unit 85. When no voltage is applied, $t_{off}$=270 nm and substantially no UV ray is allowed to be transmitted through the unit. By contrast, when a voltage is applied, $t_{on}$=180 nm and a UV ray is allowed to be transmitted through the unit.

In the flat panel display 91 having the light modulator unit 85, the diaphragm 53 is deflected in this way, whereby the multilayer film interference effect is produced so that the UV ray can be modulated.

Any combination of the distance t of the gap 11, the refractive index n, and the light reflectivities R of the dielectric multilayer film mirrors 73 and 77 may be employed as far as the interference conditions are satisfied.

When the distance t is continuously changed depending on the level of the voltage, the center wavelength of the transmission spectrum can be arbitrarily changed. This enables the amount of transmitted light to be continuously controlled. Namely, a gradation control based on the applied voltage is enabled.

When the dielectric multilayer film 1 (FIG. 1) according to the invention is applied to the dielectric multilayer film mirrors 73 and 77, the stresses, the refractive indices, the reflectivities, the optical lengths, and the like of the films or the whole multilayer film mirror in the dielectric multilayer film 1 can be set, and hence the transmission wavelength can be freely set. Therefore, the mirror can be used also in a light modulator unit which is applicable not only to a low-pressure mercury lamp light source, but also to light emitting devices such as various kinds of inorganic ELs, a low-molecular weight organic EL, a high-molecular weight EL, an inorganic semiconductor LED, and an FED.

Since the center wavelength of the transmission spectrum can be freely changed depending on a change of the gap distance t, a gradation control in a flat color display device can be more finely conducted, and hence it is expected that the characteristic can be largely improved.

Since the same material is used, the film adhesiveness is particularly improved.

Figure 10:
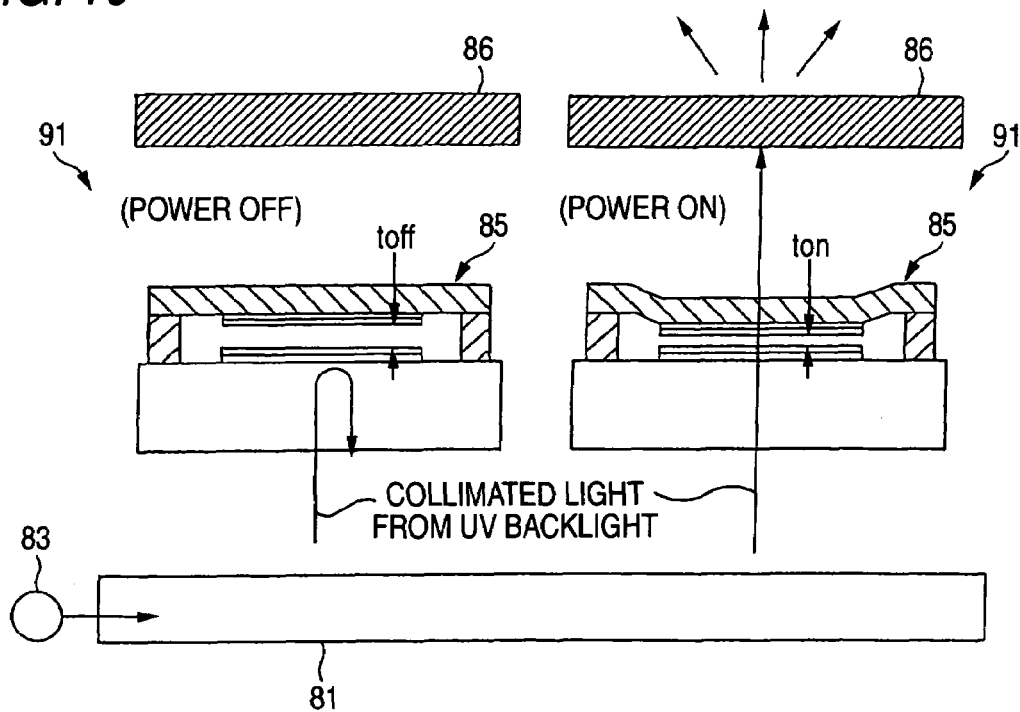
FIG. 10 is a section view showing a configuration in which a fluorescent member is placed on the flat panel display shown in FIG. 4.

FIG. 10 is a section view showing a configuration in which fluorescent members 86 are arranged in front of the respective flat panel displays 91 along the optical path.

The fluorescent members 86 receive light emitted from the respective light modulator units 85 constituting the spatial light modulator array, to be excited by the light to emit light. For example, the fluorescent members 86 emit respective ones of the three primary colors (such as red, blue, and green, or cyan, magenta, and yellow), and are arranged in adequate sequence, thereby enabling the display devices to provide a full-color display.

In each of the thus configured flat panel displays, the ultraviolet rays are converted to visible light by the fluorescent member 86, so that a visible light display can be performed.

Figure 11:
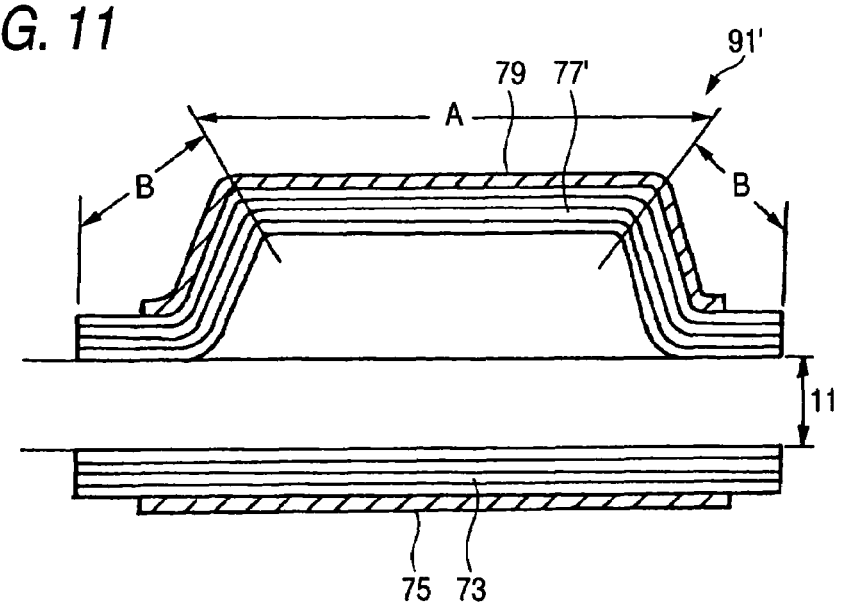
FIG. 11 is a view showing a modification of FIG. 5.

FIG. 11 is a section view of a light modulator unit of a flat panel display which is a modification of the above application example, and corresponding to FIG. 5.

In the modification, not only the dielectric multilayer film mirror 77 of FIG. 5, but also the columns 5 and the diaphragm 53 are formed with using the dielectric multilayer film according to the invention.

In the FIG.91' denotes the flat panel display of the modification. The reference numerals 73 and 77' denote the dieletric multilayer films according to the invention. 75 and 79 denote transparent electrodes, and 11 denotes a gap. These components constitute the Fabry-Perot interference flat panel display 91'.

The dieletric multilayer films and the transparent electrodes may have the same compositions as described above.

In this case, the dielectric multilayer film 77' is laid in a bridge-like manner on a sacrifice layer in a production process, and the sacrifice layer is then removed away so that a diaphragm portion A and a column portion B are integrally formed by the dielectric multilayer film 77'.

According to the configuration, the dielectric multilayer film mirror 77, the columns 5, and the diaphragm 53 in the Fabry-Perot interference flat panel display of FIG. 5 are formed by the same material. Therefore, distortion hardly occurs, the device can be easily produced, the production cost is low, and only one kind of material is required so that the modification is very advantageous also from the view point of inventory management, etc.

When the optical length is changed, the dielectric multilayer film according to the invention exerts a function of a reflecting mirror, and hence can be applied also to a reflective spatial light modulator.

Figure 12:
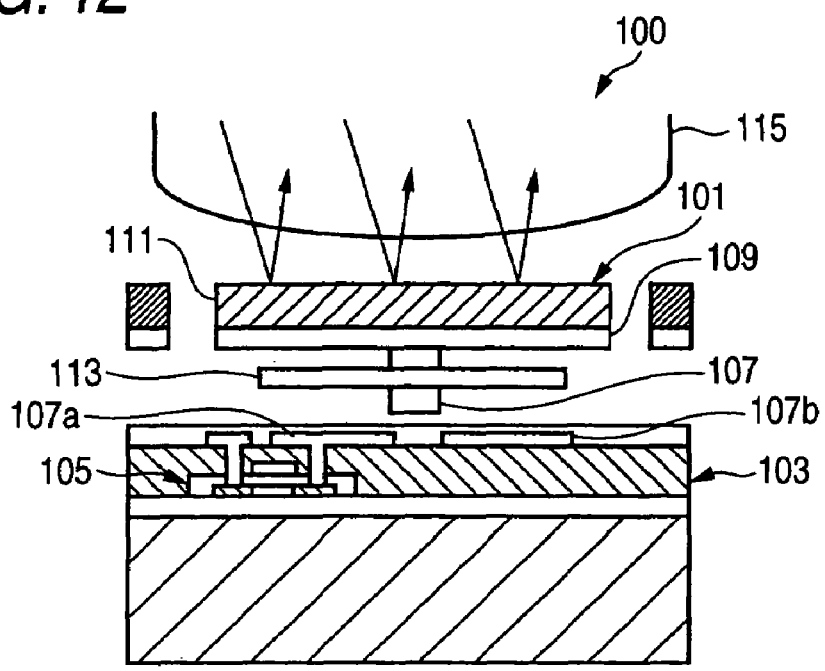
FIG. 12 is a diagram showing a light modulator unit of a reflective spatial light modulator.
Figure 13:
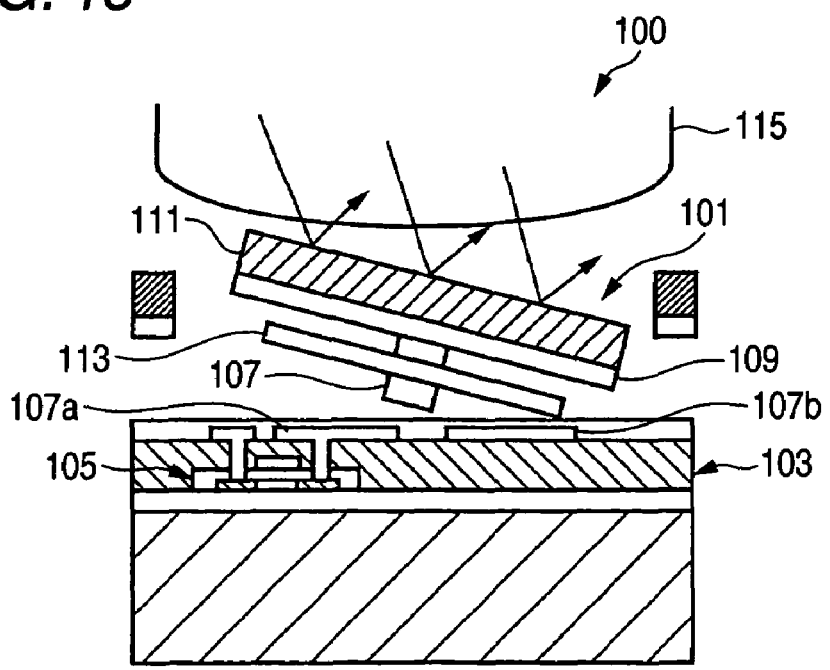
FIG. 13 is a diagram illustrating the operation of the spatial light modulator shown in FIG. 12.

FIG. 12 is a diagram showing a light modulator unit of a reflective spatial light modulator, and FIG. 13 is a diagram illustrating the operation of the spatial light modulator shown in FIG. 12. The spatial light modulator 100 is a microelectromechanical reflective spatial light modulator in which a minute reflector 101 is displaced to change a reflection light path. On a transparent substrate 103, a pixel circuit 105 configured by a CMOS is formed in each pixel region. A pair of stationary electrodes 107a, 107b are formed in the pixel circuit 105 of the transparent substrate 103.

The reflector 101 serving as a movable unit is disposed above the transparent substrate 103. The reflector 101 is composed of a movable plate 109 which is fixed to a hinge 107, an interference mirror 111 which is formed on the surface of the movable plate 109, and a movable electrode 113 which is stretched in a wing-like shape from the hinge 107 and secured thereto. The hinge 107 is made of a flexible material, and supported by securing the ends in the direction perpendicular to the plane of the sheet of FIG. 12, to the transparent substrate 103 or the like. Therefore, the movable plate 109 and the interference mirror 111 which are integrated with the hinge 107 are supported so as to be swingable about a rotation axis which passes through the cross-sectional center of the hinge 107, and which elongates in the direction perpendicular to the plane of the sheet of FIG. 12.

The spatial light modulator 100 operates in the following manner. When a voltage is applied between the movable electrode 113 and a stationary electrode 107a or 107b by an electric signal from the pixel circuit 105, the reflector 101 is swingingly displaced (electromechanically operated) as shown in FIG. 13 by the Coulomb force due to static electricity. As a result, the reflection path of light incident on the reflector 101 is changed.

A plurality of such spatial light modulators 100 may be arranged one- or two-dimensionally to form a spatial light modulator array. In a spatial light modulator array in the form of a two-dimensional matrix in which many lines each composed of plural spatial light modulators 100 are arranged, an image which is comparable in resolution with that on a cathode-ray tube can be displayed in accordance with the mirror density of the array.

In the spatial light modulator 100, a microlens having a light converging region is disposed at least on the light incidence side. The reflector 101 is placed in the light converging region.

The interference mirror 111 is disposed in the reflector 101 of the spatial light modulator 100. In the interference mirror 111, at least a light incident region of the reflector 101 has the optical non-absorption property over the spectral range of incident light. The interference mirror 111 is a dielectric thin film in which a specific wavelength region is reflected with using interference due to a thin film having a thickness similar to the wavelength of light, and may be formed as a dielectric multilayer film in which dielectric layers of different thicknesses and refractive indices are stacked into a multilayer structure.

The dielectric multilayer film 1 (FIG. 1) according to the invention is used in the interference mirror 111.

As compared with the case where a metal filter is used as a reflective film, the reflector 101 which is irradiated with light absorbs light at a very lower degree, so that the reflector 101 generates less heat due to the light absorption. In the reflective spatial light modulator 100, therefore, the high power resistance against high power light is further enhanced, and the operation reliability can be improved.

Moreover, as compared with the case of a dielectric multilayer film made of different materials, the dielectric multilayer film has an excellent film adhesiveness, and hence is very resistant to aging.

When the dielectric multilayer film 1 (FIG. 1) according to the invention is applied to the Fabry-Perot filter of FIG. 17, the film adhesiveness is particularly improved because the same material is used. Moreover, the stress and refractive index controls can be conducted more finely. Therefore, the degree of freedom in design of the transmission property is enhanced, and the filter characteristic can be largely improved.

In the above, the embodiment has been described with respect to a dielectric multilayer film mirror, a light modulator unit of a flat panel display, a Fabry-Perot filter, and the like. The application of the invention is not limited to them. The invention can be applied in the form of a sophisticated and long-life optical functional film to all uses including a collimator and a backlight system of a display device, a reflecting mirror of a semiconductor laser, and mirrors for other organic or inorganic light emitting devices.

Next, an example will be described in which a spatial light modulator array is formed by arranged one- or two-dimensionally plural light modulator units 85 each including the above-described dielectric multilayer film 1 according to the invention, and an image forming device is configured with using the spatial light modulator array. First, an exposing device 110 will be described as an example of the image forming device.

Figure 14:
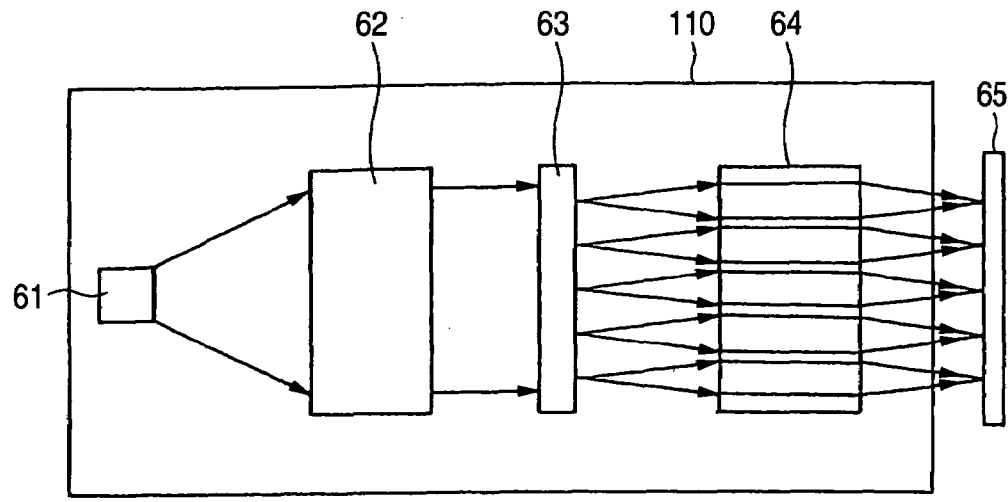
FIG. 14 is a diagram schematically showing the configuration of an exposing device which is configured by using the spatial light modulator array.

FIG. 14 is a diagram schematically showing the configuration of the exposing device which is configured by using the spatial light modulator array of the invention.

The exposing device 110 comprises: an illumination light source 61; an illumination optical system 62; a spatial light modulator array 63 in which plural spatial light modulators serving as the above-described light modulator units, are arranged two-dimensionally on the same plane; and a projection optical system 64.

The illumination light source 61 is a light source such as a laser device, a high-pressure mercury lamp, or a short arc lamp.

For example, the illumination optical system 62 is a collimating lens which converts flat light emitted from the illumination light source 61 to parallel light. The parallel light which has been transmitted through the collimating lens perpendicularly enters each of the spatial light modulators of the spatial light modulator array 63.

As the means for converting the flat light emitted from the illumination light source 61 to parallel light, known is a method of arranging two microlenses in series, in addition to the collimating lens. When a lamp having a small luminous point, such as a short arc lamp is used as the illumination light source 61, the illumination light source 61 can be deemed as a point light source, and parallel light can enter the spatial light modulator array 63. Alternatively, parallel light may be caused to enter each of the spatial light modulators of the spatial light modulator array. 63 by using an LED array having LEDs respectively corresponding to the spatial light modulators of the spatial light modulator array 63 as the illumination light source 61, and causing the LED array so as to emit light while being placed near the spatial light modulator array 63. In the case where a laser device is used as the illumination light source 61, the illumination optical system 62 may be omitted.

The projection optical system 64 projects light onto a recording medium 65 serving as an image forming face, and is configured by, for example, a microlens array having microlenses respectively corresponding to the spatial light modulators of the spatial light modulator array 63.

Hereinafter, the operation of the exposing device 110 will be described.

The flat light emitted from the illumination light source 61 impinges on the illumination optical system 62. Light which has been converted to parallel light by the system enters the spatial light modulator array 63. With respect to light entering each of the spatial light modulators of the spatial light modulator array 63, the transmittance is controlled in accordance with an image signal. Light emitted from the spatial light modulator array 63 is projected by the projection optical system 64 onto the image forming face of the recording medium 65. The projection light is projected onto the recording medium 65 while being relatively moved in a scanning direction, so that a large area can be exposed at a high resolution.

When a collimating lens is disposed on the side of the light incident face of the spatial light modulator array 63 as described above, light respectively entering the flat substrates of the spatial light modulators can be converted to parallel light.

Alternatively, the spatial light modulator array 63 may be an array in which plural spatial light modulators each formed by, for example, combining the light modulator unit 85 with the fluorescent member 86 are one-dimensionally arranged on the same plane.

In the exposing device 110, in place of the collimating lens, a microlens array may be used as the illumination optical system 62. In this case, the device is designed and adjusted so that the microlenses of the microlens array correspond to the spatial light modulators of the spatial light modulator array 63, respectively, and the axis and focal plane of each microlens coincide with the center of the corresponding spatial light modulator.

The incident light from the illumination light source 61 is converged by the microlens array into respective regions which are smaller in area than each of the spatial light modulators, and then enters the spatial light modulator array 63. With respect to light entering each of the spatial light modulators of the spatial light modulator array 63, the transmittance is controlled by a control device (not shown) in accordance with the image signal. Light emitted from the spatial light modulator array 63 is projected by the projection optical system 64 onto the image forming face of the recording medium 65. The projection light is projected onto the recording medium 65 while being relatively moved in a scanning direction, so that a large area can be exposed at a high resolution.

As described above, the light from the illumination light source 61 can be converged by the microlens array, and hence it is possible to realize an exposing device having an improved light utilization efficiency.

The shape of the lens surface of each microlens is not particularly limited and may be spherical or semispherical, or have a convex curved surface or a concave curved surface. The microlens array may be formed into a flat shape having a refractive index distribution, or may be configured by arraying Fresnel lenses or diffraction lenses due to binary optics or the like.

Examples of the material of the microlenses are transparent glass and a resin. From the viewpoint of the mass productivity, a resin is superior, and, from the viewpoint of the life period and the reliability, glass is superior. From an optical viewpoint, as the glass, quartz glass, fused silica glass, alkali-free glass, and the like are preferable, and, as the resin, an acrylic resin, an epoxy resin, a polyester resin, a polycarbonate resin, a styrene resin, a vinyl chloride resin, and the like are preferable. The resin may be of the photo curing type, the thermoplastic type, or the like. It is preferable to adequately select the type of the resin in accordance with the method of producing the microlenses.

A practical method of producing the microlenses is a method such as the cast molding method using dies, the press molding method, the injection molding method, the printing method, or the photolithography method. As a production method which can form microlenses finely and accurately at a high productivity, in the case where the microlenses are to be formed by a resin material, the cast molding method in which a photo (ultraviolet rays or the like) curing resin, or the photolithography method in which a positive or negative resist material is used is preferably used, and, in the case where the microlenses are to be formed by glass, the resist transfer method using RIE (reactive ion etching), the isotropic etching method, or the ion exchange method is preferably used.

In the case where microlenses are to be formed by the die molding method, for example, a thermoplastic resin is hot pressed by dies having a shape identical with that of the microlenses. When molding is to be conducted more finely, the molding process is preferably conducted in the following manner. A photo curing resin or a thermoplastic resin is filled into dies and then pressed, the resin is thereafter cured by light or heat, and the cured resin is separated from the dies. According to the method, fine molding is enabled. In the case where the microlenses are requested to be finely and accurately, particularly, it is preferable to use a photo curing resin which is less expanded and contracted by heat.

In the case where microlenses made of a resin are to be formed by the photolithography method, for example, a photo-dissolving resin which is typified by a transparent photoresist or a photo-curing resin is exposed by ultraviolet rays (or visible rays) through an adequately patterned light shielding mask, and exposed portions or unexposed portions are dissolved and developed to form microlenses. As a result, in accordance with the resin material and the exposure amount distribution, it is possible to obtain microlenses of a desired shape. Depending on the resin material, a high-humidity baking process may be conducted after developing, and microlenses of a desired shape may be obtained by means of the surface tension when the resin material is thermally softened (the reflow method).

In the case where microlenses made of glass are to be formed by the photolithography method, for example, the microlenses are formed by etching a transparent substrate on which spatial light modulators are configured, and through which light from the above-mentioned light source can be transmitted. In the etching process, when a film is applied in a shape corresponding to the microlenses, the substrate can be easily processed into the desired shape.

Next, a projecting device will be described as another example of the image forming device.

Figure 15:
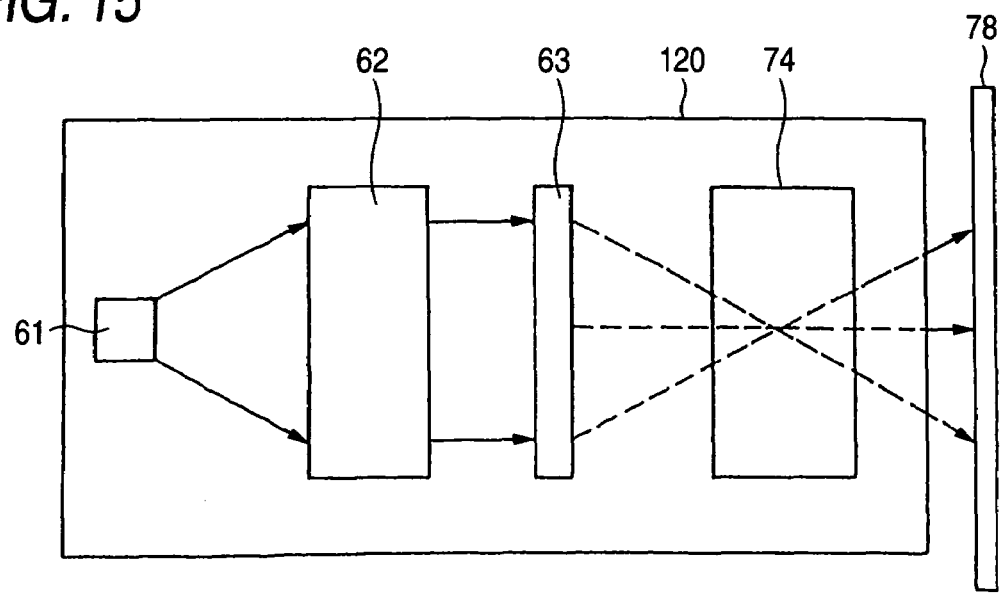
FIG. 15 is a diagram schematically showing the configuration of a projecting device which is configured by using the spatial light modulator array.
Figure 16:
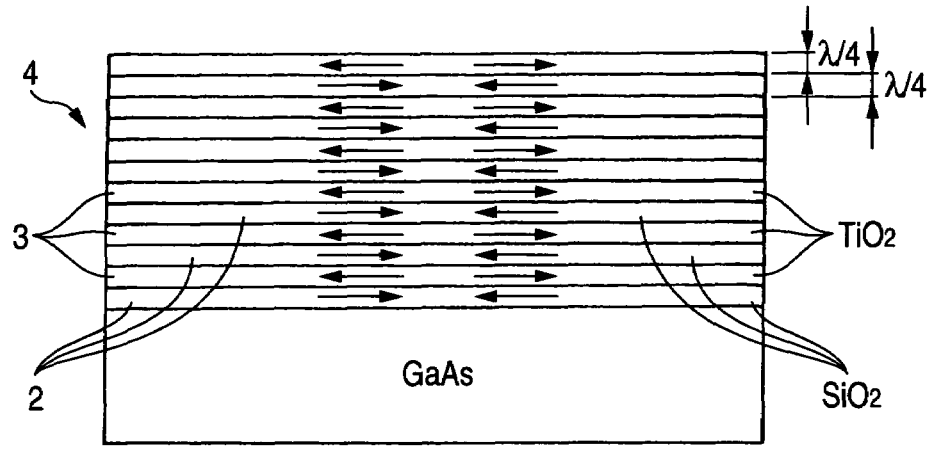
FIGS. 16A and 16B are section views of a multilayer film structure disclosed in JP-A-8-307008.
Figure 16:
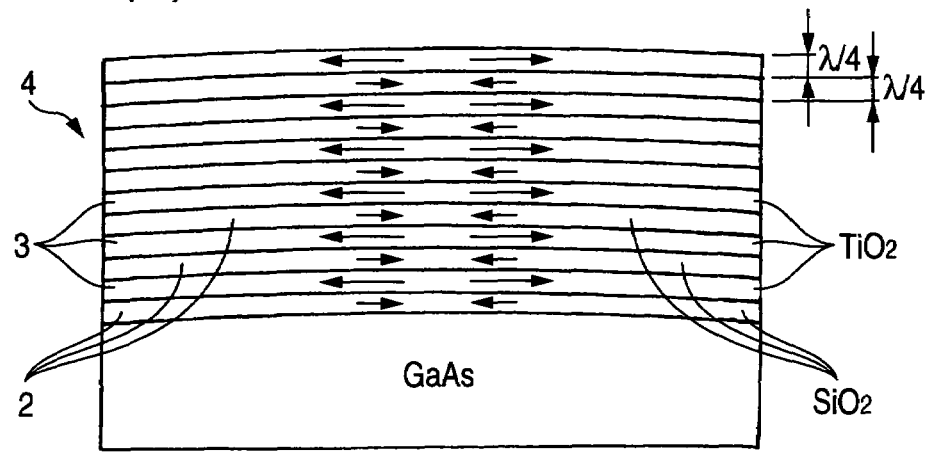

FIG. 15 is a diagram schematically showing the configuration of a projecting device which is configured by using the spatial light modulator array of the invention. The components identical with those of FIG. 14 are denoted by the same reference numerals, and their description is omitted.

A projector 120 serving as a projecting device comprises an illumination light source 61; an illumination optical system 62; a spatial light modulator array 63; and a projection optical system 74.

The projection optical system 74 is an optical system for the projecting device which projects light onto a screen 78 functioning as an image forming face.

The illumination optical system 62 may be the above-described collimating lens, or a microlens array.

Hereinafter, the operation of the projecting device 120 will be described.

The incident light from the illumination light source 61 is converged by the microlens array into respective regions which are smaller in area than each of the spatial light modulators, and then enters the spatial light modulator array 63. With respect to light entering the optical functional film of each of the spatial light modulators of the spatial light modulator array 63, the transmittance is controlled in accordance with the image signal. Light emitted from the spatial light modulator array 63 is projected by the projection optical system 74 onto the image forming face of the screen 78.

As described above, when the flat panel display 91 or 91', the spatial light modulator array 63, or the exposing device 110 or the projecting device 120 which serves as an image forming device is formed with using spatial light modulators including the dielectric multilayer film 1 according to the invention, the device can be produced by a simple production process and at a low production cost.

As described above, according to the invention, stresses of vertically adjacent films of a multilayer film which is grown by plasma CVD with using the same material are controlled so as to have opposite signs and an equal magnitude. Therefore, the invention can attain the effects that the stress and refractive index controls can be easily conducted, that a stress of the whole multilayer film can be controlled, that the film growth rate is high, and that the film adhesiveness is excellent.

Consequently, all devices in which a conventional dielectric multilayer film is used can be replaced with the optical functional film according to the invention. As a result, a dielectric multilayer film is obtained in which the stress and refractive index controls can be easily conducted, a stress of the whole multilayer film can be controlled, the film growth rate is high, and the film adhesiveness is excellent.

Moreover, the film can function also as a column of a spatial light modulator. In the device, therefore, distortion hardly occurs, the device can be easily produced, and the production cost is low. Furthermore, a spatial light modulator, a spatial light modulator array, an image forming device, and a flat panel display can be economically produced.

What is claimed is:

1. A spatial light modulator comprising:
   a support substrate that has an electrode layer; and
   a movable thin film that has at least an electrode layer, said movable thin film being opposingly placed above said support substrate with being separated by a predetermined gap distance in a manner that said movable thin film is flexurally deformable toward said support substrate, wherein a predetermined driving voltage is applied between said electrode layer of said support substrate and said electrode layer of said movable thin film to cause said movable thin film to be deflected toward said support substrate by an electrostatic force acting between said electrode layers, whereby optical characteristics of said device with respect to incident light are changed to perform light modulation on the incident light, wherein an optical functional film having a plurality of stacked films is disposed on each of sides of said movable thin film and said support substrate, said sides being opposed to each other, and said optical characteristics are optical interference characteristics corresponding to the gap distance between said movable thin film and said support substrate, and a wavelength of the incident light, wherein the plurality of stacked films are formed of SiNx, and refractive indices of adjacent ones of the plurality of films are different from each other, and wherein stresses of prescribed ones of the plurality of films of the multilayer film have opposite signs with respect to adjacent ones of the plurality of films.

2. A spatial light modulator array wherein plural spatial light modulators according to claim 1 are arranged one- or two-dimensionally.

3. An image forming device comprising:

a light source;

a spatial light modulator array according to claim 1;

an illumination optical system which illuminates said spatial light modulator array with light from said light source; and a projection optical system which projects light emitted from said spatial light modulator array onto an image forming face.

4. A flat panel display comprising:

a light source which emits ultraviolet rays;

a spatial light modulator array according to claim 1;

an illumination optical system which illuminates said spatial light modulator array with light from said light source; and a fluorescent member which is excited by light emitted from said spatial light modulator array to emit light.

5. The spatial light modulator of claim 1 wherein the plurality of stacked films of optical functional film are grown by chemical vapor deposition (CVD).

* * * * *